(12) United States Patent
Chakkirala et al.

(10) Patent No.: US 11,876,493 B2
(45) Date of Patent: Jan. 16, 2024

(54) HYBRID CLASS-H/PREDICTIVE CLASS-G SWITCHING AMPLIFIER ARCHITECTURE

(71) Applicant: QUALCOMM Incorporated, San Diego, CA (US)

(72) Inventors: Subbarao Surendra Chakkirala, San Jose, CA (US); Sherif Galal, Irvine, CA (US); Earl Schreyer, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 30 days.

(21) Appl. No.: 17/649,967

(22) Filed: Feb. 4, 2022

(65) Prior Publication Data

US 2023/0253934 A1 Aug. 10, 2023

(51) Int. Cl.
*H03F 3/217* (2006.01)
*H03F 1/02* (2006.01)

(52) U.S. Cl.
CPC ......... *H03F 3/2175* (2013.01); *H03F 1/0227* (2013.01); *H03F 2200/03* (2013.01)

(58) Field of Classification Search
CPC ... H03F 3/2175; H03F 1/0227; H03F 2200/03
USPC ....................... 330/10, 207 A, 251
See application file for complete search history.

(56) References Cited

U.S. PATENT DOCUMENTS 10,243,524 B2 * 3/2019 Orr .................. G05F 1/575
11,387,732 B2 * 7/2022 King ................ H02M 3/1584
2011/0050349 A1 3/2011 Strickland et al.
2015/0030183 A1 1/2015 Pazhayaveetil et al.
2018/0248525 A1 8/2018 Orr

OTHER PUBLICATIONS

International Search Report and Written Opinion—PCT/US2023/060747—ISA/EPO—dated Apr. 28, 2023.
Russo P., et al., "Dynamic Voltage Scaling for Series Hybrid Amplifiers", Microelectronics Journal, vol. 44, No. 9, Dec. 31, 2013, pp. 753-763, XP028720421, ISSN: 0026-2692, DOI: 10.1016/J.MEJ0.2013.03.016, Abstract, Figures 3,4.
Zhang X., et al., "An 80.4% Peak Power Efficiency Adaptive Supply Class H Power Amplifier for Audio Applications", IEEE Transactions on Very Large Scale Integration (VLSI) Systems, IEEE Service Center, Piscataway, NJ, USA, vol. 25, No. 6, Jun. 2, 2017, pp. 1954-1965, XP011650092, ISSN: 1063-8210, DOI: 10.1109/TVLSI.2017.2666268, Abstract, Figures 1,2.

* cited by examiner

*Primary Examiner* — Hieu P Nguyen
(74) *Attorney, Agent, or Firm* — Patterson + Sheridan, L.L.P.

(57) ABSTRACT

A hybrid class-H/predictive class-G switching amplifier architecture and techniques for amplifying a signal (e.g., an audio signal) using such an architecture. One example method of amplification generally includes delaying an input signal to generate a delayed version of the input signal, amplifying the delayed version of the input signal with an amplifier powered by a boost converter, and selectively controlling the boost converter to operate in at least one of a predictive class-G mode or a class-H mode, based on a magnitude of the input signal.

20 Claims, 7 Drawing Sheets

HYBRID CLASS-H/PREDICTIVE CLASS-G SWITCHING AMPLIFIER ARCHITECTURE

TECHNICAL FIELD

Certain aspects of the present disclosure generally relate to electronic circuits and, more particularly, to power amplifiers, such as audio amplifiers.

BACKGROUND

A speaker is a transducer that produces a pressure wave in response to an input electrical signal, and thus, sound is generated. The speaker input signal may be produced by an audio amplifier (also referred to as a "power amplifier") that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to a hybrid class-H/predictive class-G switching amplifier architecture and techniques for amplifying a signal using such an architecture.

Certain aspects of the present disclosure are directed to an amplification circuit. The amplification circuit generally includes a delay element; an amplifier having an input coupled to an output of the delay element; a boost converter having an output coupled to a power supply input of the amplifier; and control logic having a first input coupled to an input of the delay element, having a second input coupled to the output of the delay element, and having an output coupled to a control input of the boost converter, wherein the control logic is configured to selectively control the boost converter to operate in at least one of a predictive class-G mode or a class-H mode, based on a magnitude of an input signal.

Certain aspects of the present disclosure are directed to a method of amplification. The method generally includes delaying an input signal to generate a delayed version of the input signal, amplifying the delayed version of the input signal with an amplifier powered by a boost converter, and selectively controlling the boost converter to operate in at least one of a predictive class-G mode or a class-H mode, based on a magnitude of the input signal.

Certain aspects of the present disclosure are directed to an apparatus for amplification. The apparatus generally includes means for delaying an input signal to generate a delayed version of the input signal; means for amplifying the delayed version of the input signal; means for regulating power to the amplifier; and means for selectively controlling the means for regulating power to operate in at least one of a predictive class-G mode or a class-H mode, based on a magnitude of the input signal.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide a hybrid class-H/predictive class-G switching amplifier architecture and techniques for amplifying a signal using such an architecture. Such a hybrid amplifier architecture may provide very high power (e.g., >7 W) at mid-to-high frequencies, without compromising on efficiency at low power (e.g., <1 W).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Audio System with a Power Amplifier

Figure 1:
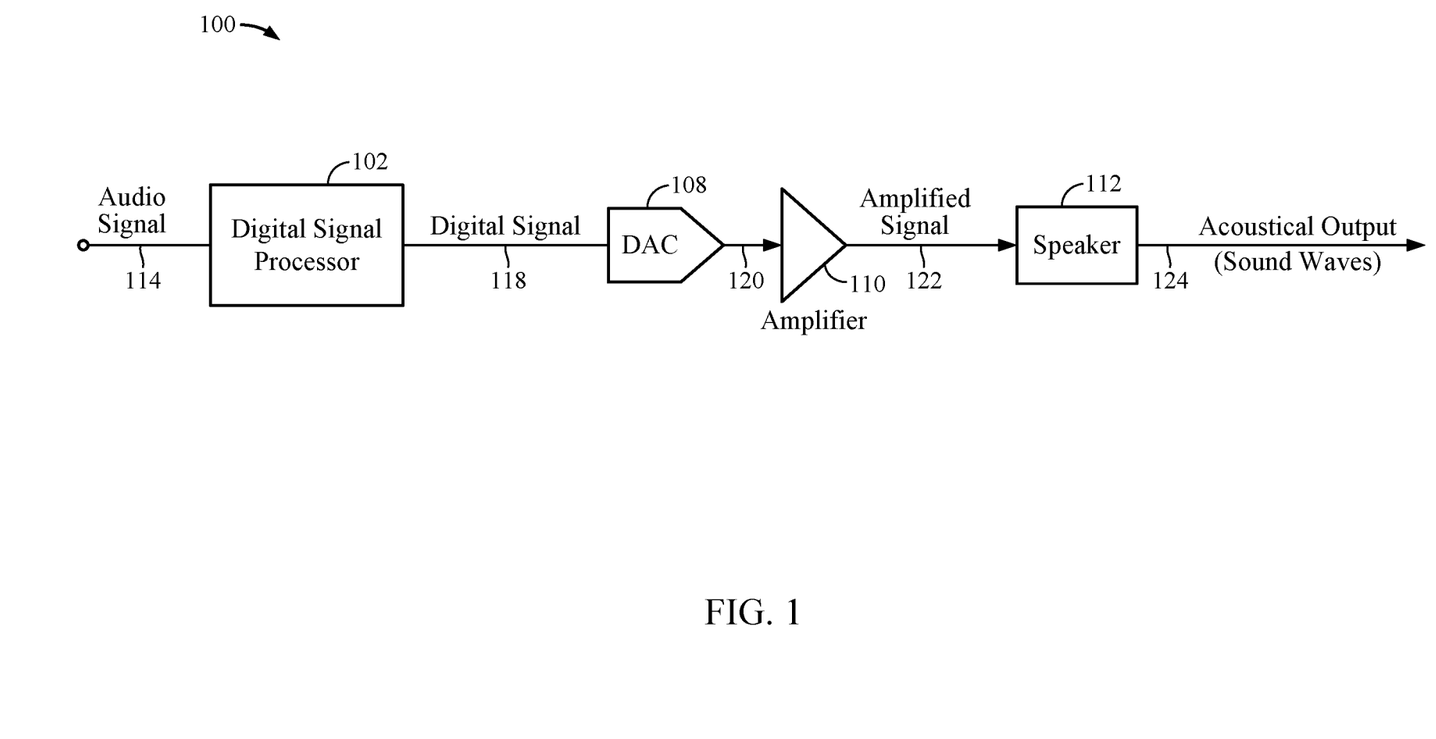
FIG. 1 illustrates an example audio amplifier system, in which aspects of the present disclosure may be practiced.

FIG. 1 illustrates an example audio system 100, in which aspects of the present disclosure may be practiced. However, it is to be understood that aspects of the present disclosure may also be practiced in any of various other suitable amplification scenarios.

As illustrated in FIG. 1, a digital signal processor (DSP) 102 may receive and process audio signals 114 (e.g., a digital audio signal) by, for example, applying a digital filter aimed at increasing audio quality. The filtered or otherwise processed digital signal 118 produced by the DSP 102 (or a further processed version thereof) may be converted to an analog signal 120 using a digital-to-analog converter (DAC) 108. In certain aspects, the DAC may be implemented as part of the DSP 102 or an amplifier 110. In certain aspects, the analog signal 120 may be amplified using the amplifier 110 to generate an amplified signal 122. The amplified signal 122 may drive a speaker 112 to produce an acoustic output 124 (e.g., sound waves). In other words, the amplifier 110 may function as a speaker driver.

High output volume in mobile devices is becoming increasingly important in next-generation devices. Higher volume translates to higher audio amplifier output power. Higher output power may be difficult to achieve with the relatively low voltages provided by lithium-ion batteries. Therefore, boost converters may be used to boost the battery voltage to a higher level that supplies the audio power amplifier (e.g., amplifier 110). For certain aspects, the amplifier 110 may be implemented as a class-D amplifier due to the relatively high power efficiency associated with class-D amplifiers. The efficiency of the class-D amplifier may be further improved by implementing the class-D amplifier in an H-bridge configuration, for example. However, some class-D amplifiers may not be capable of delivering high power (e.g., above 4 W) due to limited battery current and/or limited battery voltage. Therefore, other amplifier architectures may be utilized in some aspects to deliver high power.

Other amplifier types capable of delivering high power include class-H and class-G amplifiers, in which the power supply rail is varied to follow the input speaker signal (referred to as "rail voltage modulation"), where the input speaker signal may be the amplified signal 122. In class-H amplifiers, the power supply rail is continuously variable, whereas in class-G amplifiers, there may be different discrete levels for the power supply rail to switch between, based on the input speaker signal. Class-H amplifiers are sometimes referred to as "rail trackers" because the amplifiers modulate the supply rails so that the rails are only a few volts larger than the amplifier output signal, "tracking" this signal at any given time. Class-G amplifiers, on the other hand, may have several power rails at different voltage levels and may switch between the rails as the output signal approaches each level.

Example Hybrid Class-H/Predictive Class-G Amplifier

A voltage regulator ideally provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A linear regulator may be implemented by a low-dropout (LDO) regulator, for example. A switching regulator may be implemented by a switched-mode power supply (SMPS), such as a buck converter, a boost converter, a buck-boost converter, or a charge pump.

For example, a boost converter is a type of SMPS for stepping up voltage (and stepping down current) from the input to the output. A boost converter typically includes: (1) an inductor coupled between an input supply node and a switching node, (2) a switch coupled between the switching node and a reference potential node, (3) and another switch (or a diode) coupled between the switching node and a load (e.g., represented by a shunt capacitive element). The switches are typically implemented with power transistors.

Figure 2A:
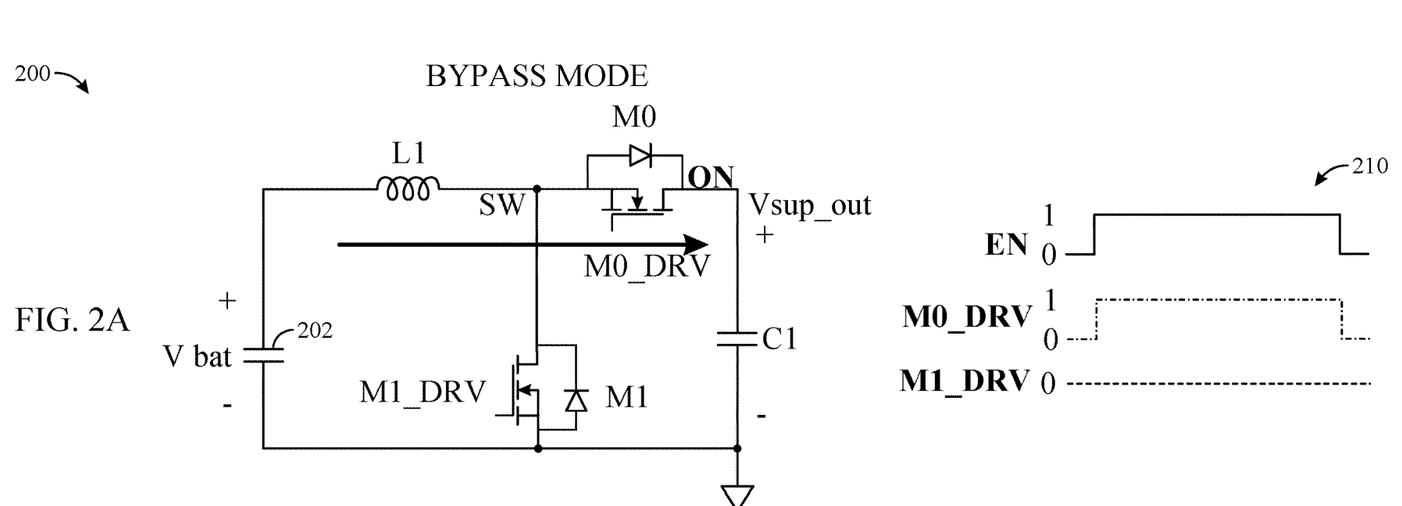
FIG. 2A is a circuit diagram of an example boost converter operating in a bypass mode and a corresponding signal timing diagram, in accordance with certain aspects of the present disclosure.

FIG. 2A is a circuit diagram of an example boost converter 200 operating in a bypass mode and a corresponding signal timing diagram 210, in accordance with certain aspects of the present disclosure. The boost converter 200 includes an inductive element L1 and a switch (implemented by transistor M1), both coupled to a switching node (labeled "SW"). The boost converter 200 also includes a switch (implemented by transistor M0) coupled between the switching node and an output node of the boost converter, with output supply voltage Vsup_out. The switches may each be implemented by one or more transistors, which may be n-type field-effect transistors (NFETs) or p-type field-effect transistors (PFETs). For example, although transistors M0 and M1 are depicted in FIG. 2A as being implemented by NFETs, the reader is to understand that transistors M0 and M1 may be implemented as PFETs in other aspects, in which case the gate drive polarities may be reversed. The output node may be coupled to an energy storage device (e.g., capacitive element C1) and a load (e.g., an amplifier, such as amplifier 110).

The boost converter 200 may be configured to operate in the bypass mode, as shown in FIG. 2A, when an input signal magnitude (e.g., a magnitude of an amplifier input signal, such as analog signal 120) is below a threshold (e.g., threshold 252 in FIG. 2C). While operating in the bypass mode, the switch corresponding to transistor M1 may be opened while the switch corresponding to transistor M0 is closed, transferring the energy stored in the inductive element L1 (if any) and providing energy from an input voltage source 202 (e.g., a battery with battery voltage Vbat) through transistor M0 to the capacitive element C1. As shown in the timing diagram 210, the gate drive signal (labeled "M0_DRV") for transistor M0 may transition to and remain "high" (e.g., logic 1) while the boost converter 200 is enabled (while the enable (EN) signal is logic 1), whereas the gate drive signal (labeled "M1_DRV") for transistor M1 may remain "low" (e.g., logic 0), such that the transistor M0 remains in an "ON" state and the transistor M1 remains in an "OFF" state during the bypass mode.

The boost converter 200 may alternatively be operated in a boost mode. In the boost mode, transistors M0 and M1 may be controlled by pulse-width modulation (PWM) signals to open and close the transistors in an effort to regulate a voltage across the capacitive element C1 (i.e., the voltage Vsup_out), where this output voltage is greater than the input voltage (Vbat).

Figure 2B:
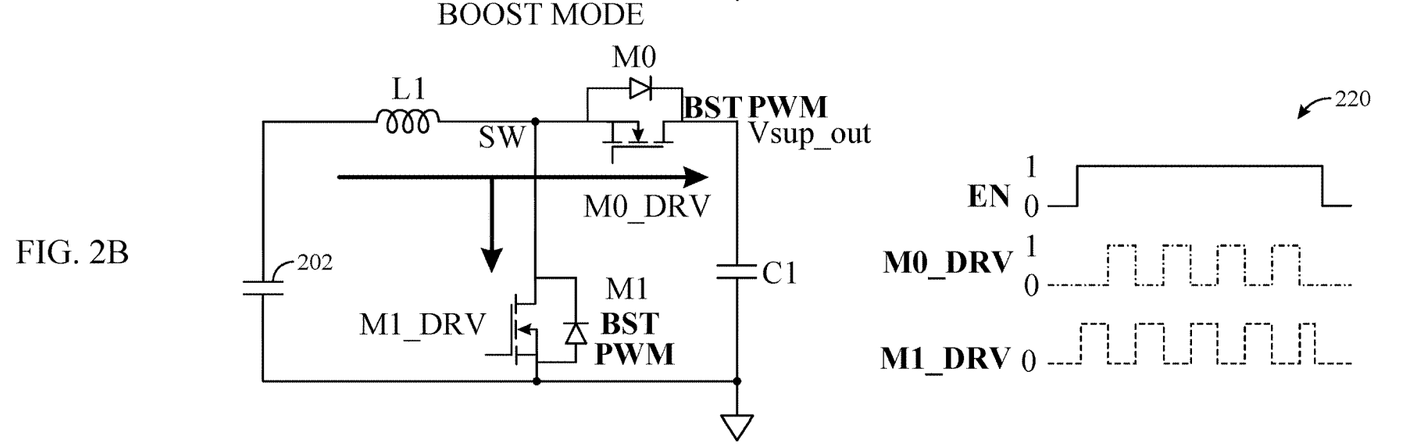
FIG. 2B is a circuit diagram of the boost converter of FIG. 2A operating in a boost mode and a corresponding signal timing diagram, in accordance with certain aspects of the present disclosure.

FIG. 2B is a circuit diagram of the boost converter 200 of FIG. 2A operating in a boost mode and a corresponding signal timing diagram 220, in accordance with certain aspects of the present disclosure. The boost converter 200 may be configured to operate in the boost mode when the input signal magnitude is above the threshold (e.g., threshold 252 in FIG. 2C).

As shown in the timing diagram 220, while operating in the boost mode, the gate drive signals M0_DRV and M1_DRV may alternate between "low" (e.g., logic 0) and "high" (e.g., logic 1) such that the transistors M0 and M1 are modulated between an "ON" state and an "OFF" state, complementary to one another. In certain aspects, transistor M0 may be replaced with a diode, and the energy stored in the inductive element L1 may be transferred to the capacitive element C1 via the diode when transistor M1 is in the "OFF" state, such that the diode is forward biased.

Figure 2C:
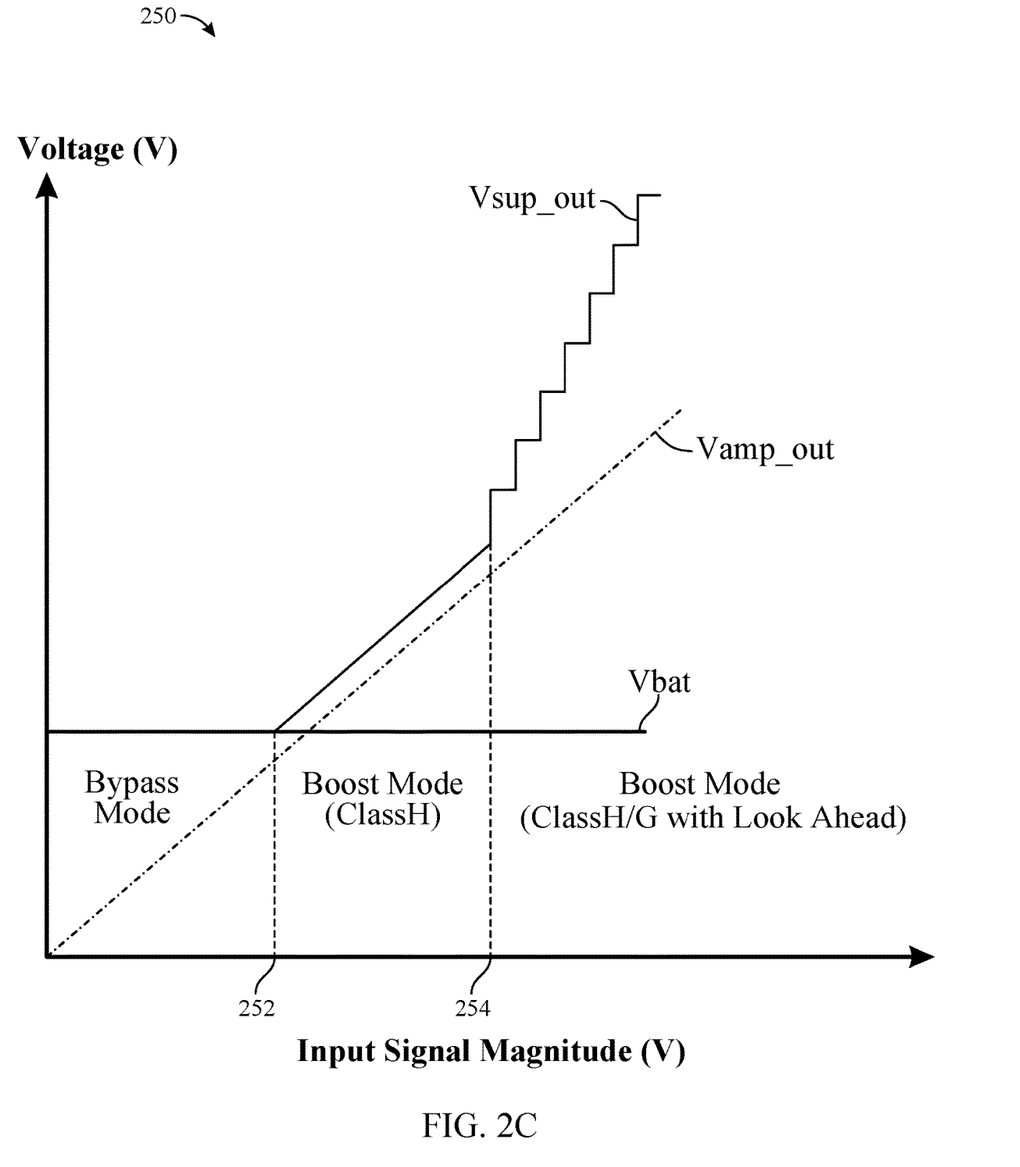
FIG. 2C is a graph of various voltage signals compared to an input signal magnitude, illustrating bypass mode, class-H boost mode, and predictive class-G boost mode, in accordance with certain aspects of the present disclosure.

With the boost mode, the boost converter 200 may provide power to a power input of an amplifier in a class-H amplifier architecture, such that the power supply voltage (i.e., voltage Vsup_out) can be regulated (using PWM applied to the gates of transistors M0 and M1) to track the amplifier output voltage (labeled "Vamp_out" in FIG. 2C) above the threshold 252 and provide sufficient amplifier headroom margin, as illustrated in FIG. 2C. Although class-H amplifiers may be capable of efficiently delivering medium to high power levels (e.g., from 1 W to 7 W), some class-H amplifiers are not capable of supporting higher power (e.g., greater than 7 W) because of limited battery current. On the other hand, class-G amplifiers may be capable of delivering higher power (e.g., greater than 7 W) at mid-to-high frequencies, but may have relatively poor efficiency compared to class-H amplifiers. Accordingly, certain aspects of the present disclosure provide an amplification circuit configured to selectively control a boost converter to operate in a class-H mode or a predictive class-G mode based on a magnitude of an input signal.

FIG. 2C is a graph 250 of various voltage signals compared to an input signal magnitude, illustrating bypass mode, class-H boost mode, and predictive class-G boost mode, in accordance with certain aspects of the present disclosure. As shown, a boost converter may be configured to operate in the bypass mode (as discussed with respect to FIG. 2A) when the magnitude of the input signal (e.g., an analog amplifier input signal or a digital input signal) is below a first threshold 252. In the bypass mode, the output voltage Vsup_out of the boost converter may be the same as, or at least substantially similar to, the input voltage Vbat supplied by a voltage supply (e.g., input voltage source 202 in FIGS. 2A and 2B), such as a battery. The amplifier output signal Vamp_out increases linearly with the input signal magnitude (in both bypass and boost modes).

When the input signal magnitude exceeds the first threshold 252 but remains below a second threshold 254, the boost converter may be configured to operate in a class-H boost mode (as discussed with respect to FIG. 2B). As shown, when operating in the class-H boost mode, the output voltage Vsup_out of the boost converter may increase (e.g., linearly) as the input signal magnitude increases between the first threshold 252 and the second threshold 254, to track the voltage Vamp_out. In some examples, when operating in the class-H boost mode, the headroom between the output voltage Vsup_out and the voltage Vamp_out may be relatively small compared to the headroom space achieved in other operating modes. For example, the headroom in the class-H boost mode may be 1.5 V.

When the input signal magnitude exceeds the second threshold 254, the boost converter may be configured to operate in a predictive class-G boost mode. As shown in FIG. 2C, when operating in the predictive class-G boost mode, the output signal Vsup_out of the boost converter may increase with multiple discrete levels as the voltage Vamp_out increases (e.g., a step function). Furthermore, the predictive class-G boost mode may provide relatively large headroom compared to the class-H boost mode, and this headroom margin may become larger as the voltage Vamp_out increases, as illustrated.

Figure 3A:
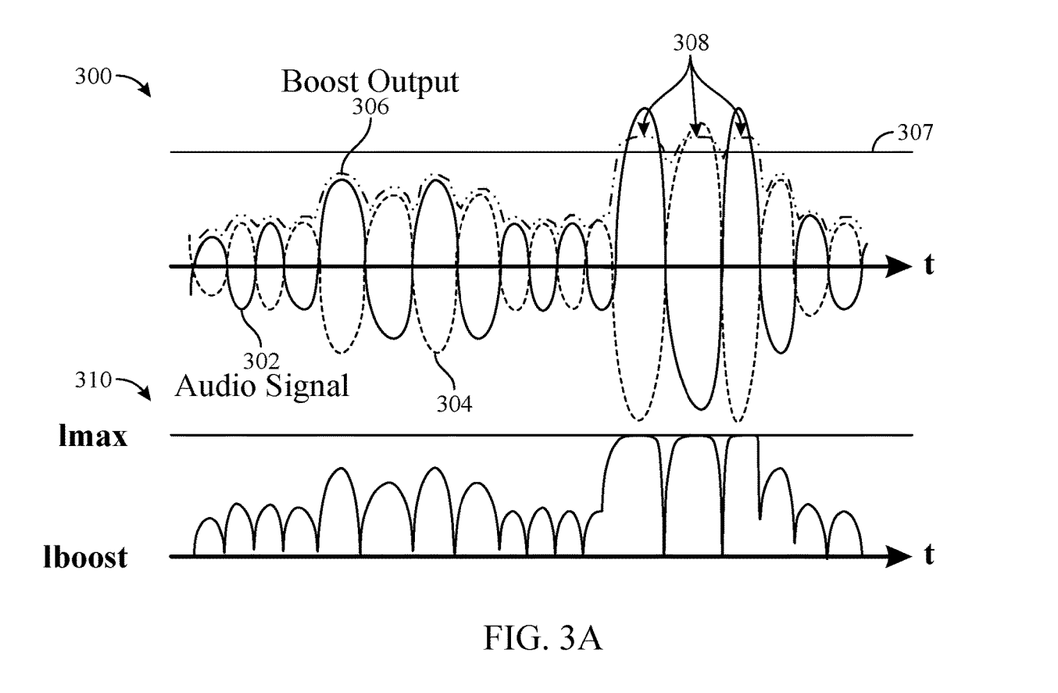
FIG. 3A is a plot of a boost converter output signal tracking an example audio signal in a class-H amplifier and a corresponding current plot.

FIG. 3A is a plot 300 of a boost converter output signal 306 tracking an example audio signal 302 in a class-H amplifier and a corresponding current plot 310 illustrating an output current Iboost from the boost converter. The complementary signal 304 of audio signal 302 is also shown. The audio signal 302 (and its complement) may represent amplified output signals, such as the amplified signal 122 from the output of the amplifier 110 in FIG. 1.

As shown, while operating in the class-H boost mode, the boost converter output signal 306 generally tracks the absolute value (also referred to as the magnitude) of the audio signal 302, while maintaining some headroom for the amplifier powered by the boost converter and generating the audio signal. However, when the magnitude of the audio signal 302 exceeds a particular level 307, clipping of the boost converter output signal 306 may occur (as illustrated at points 308), and the boost converter output signal 306 may not be able to provide the power demanded by the audio signal 302. This signal clipping may occur due to the boost converter output current Iboost being limited by the maximum battery current Imax (e.g., of the input voltage source 202), as illustrated in the current plot 310. In other words, although a class-H amplifier may work well for mid-to-high power levels, a class-H amplifier may be limited at very high power levels (e.g., above the level 307) and may not be able to provide sufficient headroom to the amplifier at these levels.

The clipping associated with class-H amplifiers may be addressed by using a class-G amplifier, which can deliver very high power (e.g., >7 W). However, class-G amplifiers are typically less efficient than class-H amplifiers, which is undesirable. Accordingly, certain aspects of the present disclosure provide techniques and apparatus for selectively controlling a boost converter to operate in a class-H mode or a predictive class-G mode based on a magnitude of an input signal.

Figure 3B:
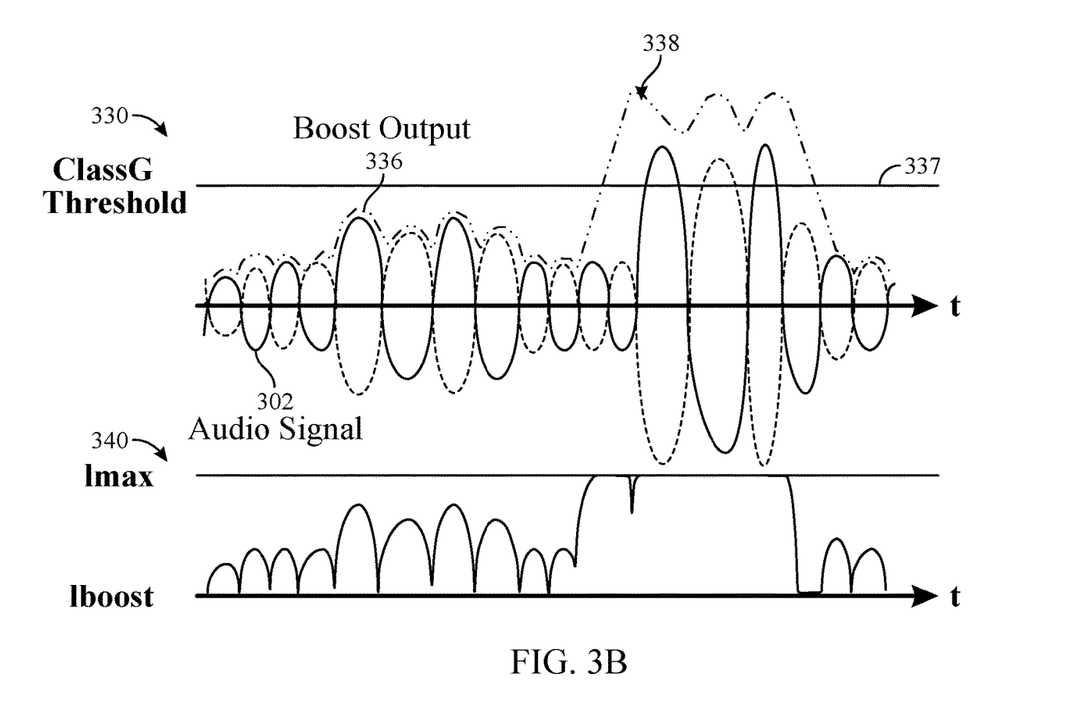
FIG. 3B is a plot of a boost converter output signal tracking the same audio signal in a hybrid class-H/predictive class-G amplifier with a single class-G threshold and a corresponding current plot, in accordance with certain aspects of the present disclosure.

FIG. 3B is a plot 330 of a boost converter output signal 336 tracking the same audio signal 302 in a hybrid class-H/predictive class-G amplifier with a single class-G threshold 337 and a corresponding current plot 340, in accordance with certain aspects of the present disclosure.

When the audio signal 302 is effectively predicted (e.g., for a predefined look-ahead interval) to be below the class-G threshold 337, the hybrid class-H/predictive class-G amplifier may operate in a class-H boost mode, and as such, the boost converter output signal 336 may be similar to the boost converter output signal 306 in FIG. 3A in that the boost converter output signal 336 may generally track the magnitude of the audio signal 302. However, when the magnitude of the audio signal 302 is effectively predicted to exceed the class-G threshold 337 (e.g., in the look-ahead interval), the hybrid class-H/predictive class-G amplifier may be configured to operate in the predictive class-G boost mode. In this mode, the hybrid class-H/predictive class-G amplifier may increase the boost converter output signal 336 before the audio signal 302 reaches a magnitude exceeding the class-G threshold 337 and the capabilities of the class-H boost mode. As a result, unlike the boost converter output signal 306 in FIG. 3A, the boost converter output signal 336 in FIG. 3B operating in the predictive class-G boost mode is not clipped when delivering higher power to the amplifier, even though the boost converter output current Iboost may hit the maximum battery current Imax, as shown in the current plot 340.

As shown in FIG. 3B, before the magnitude of the audio signal 302 exceeds the class-G threshold 337, the hybrid class-H/predictive class-G amplifier increases the boost converter output signal 336 to the same single voltage level, which is higher than the predicted magnitude of the audio signal 302 to provide sufficient headroom between the boost converter output signal 336 (e.g., the power supply voltage for an amplifier) and the actual audio signal 302 being amplified by the amplifier at a given time t. Although the boost converter output signal 336 begins drooping after initially being raised (due to the predicted magnitude of the audio signal 302 starting to decrease), the hybrid amplifier may be designed such that the boost converter output signal 336 remains at a higher voltage than the magnitude of the actual audio signal 302 at any given time (e.g., at point 338) despite the drooping because of the initial headroom created during the ramp-up of the boost converter output signal 336 and the relatively slow decay time of this signal. This decay time may be balanced with the frequency of the audio signal 302 and may be a function of the capacitance of capacitive element C1 and the load current (for a given input current limit).

Figure 3C:
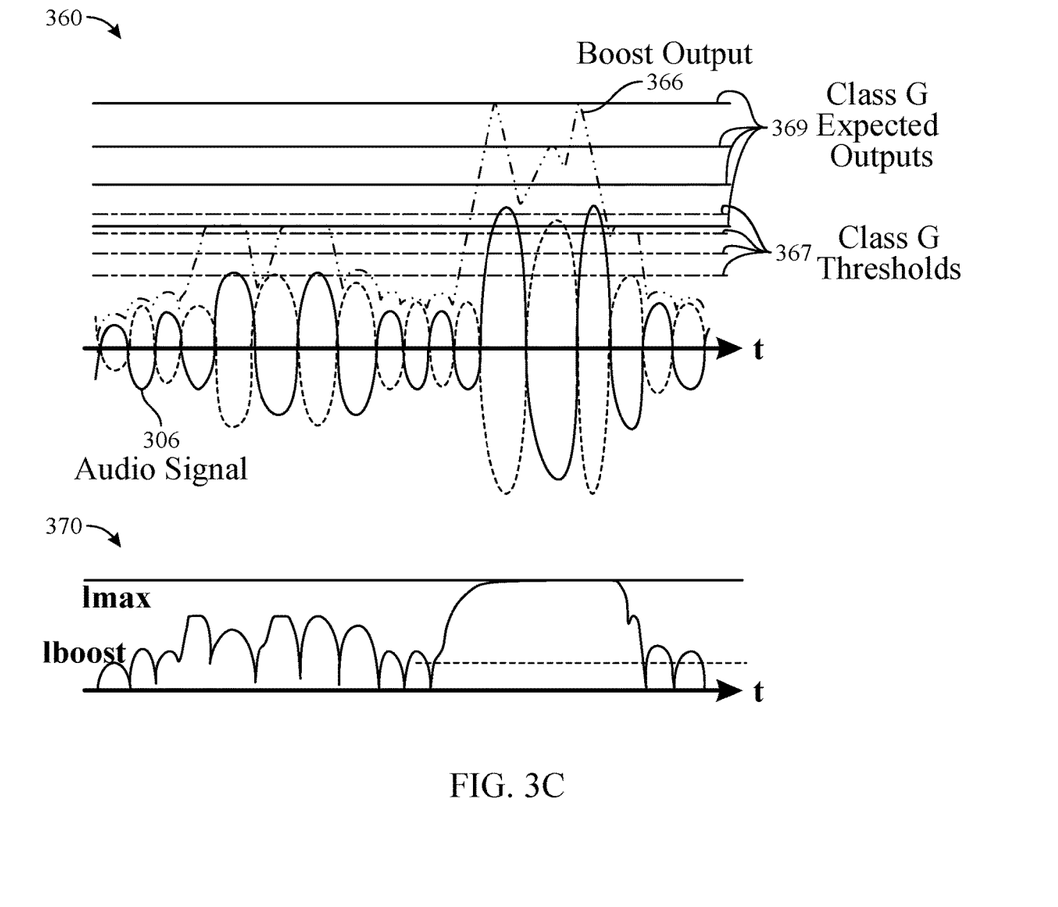
FIG. 3C is a plot of a boost converter output signal tracking the same audio signal in a hybrid class-H/predictive class-G amplifier with multiple class-G thresholds and a corresponding current plot, in accordance with certain aspects of the present disclosure.

FIG. 3C is a plot 360 of a boost converter output signal 366 tracking the same audio signal 302 in a hybrid class-H/predictive class-G amplifier with multiple class-G thresholds 367 and a corresponding current plot 370, in accordance with certain aspects of the present disclosure.

The boost converter output signal 366 may be similar to the boost converter output signal 336 in FIG. 3B, except that the boost converter output signal 366 in FIG. 3C may achieve different class-G expected output values 369 (i.e., different voltage levels) based on which of the class-G thresholds 367 the predicted magnitude of the audio signal 302 exceeds. For example, if the predicted magnitude of the audio signal 302 is 10 V (which exceeds a first class-G threshold), then the corresponding class-G expected output value 369 may be 14 V, and the boost converter output signal 366 may be boosted to 14 V. As another example, if the predicted magnitude of the audio signal 302 is 11 V (which exceeds a second class-G threshold, higher than the first class-G threshold), then the corresponding class-G expected output value 369 may be 16 V, and the boost converter output signal 366 may be boosted to 16 V to provide sufficient headroom.

For certain aspects, the hybrid class-H/predictive class-G amplifier may be configured to maintain the boost converter output signal 366 at the class-G expected output value 369 for a preconfigured period in order to reduce the likelihood that the magnitude of the boost converter output signal 366 decreases prematurely.

Figure 4:
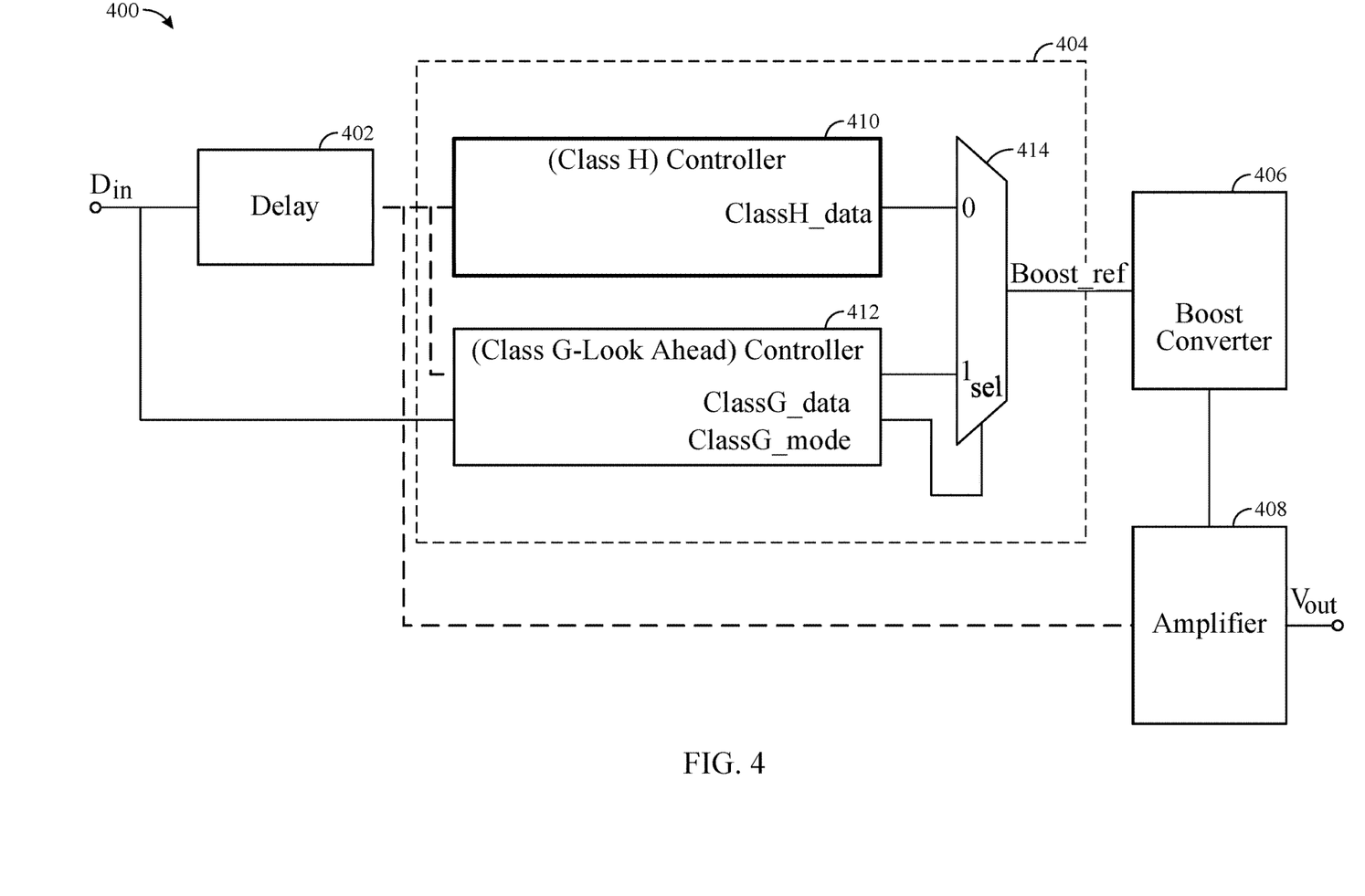
FIG. 4 is a block diagram of an example amplification circuit for implementing a hybrid class-H/predictive class-G amplifier, in accordance with certain aspects of the present disclosure.

FIG. 4 is a block diagram of an example amplification circuit 400 for implementing a hybrid class-H/predictive class-G amplifier, in accordance with certain aspects of the present disclosure. The amplification circuit 400 may generally include a delay element 402, control logic 404, a boost converter 406, and an amplifier 408.

The delay element 402 may be implemented by any of various suitable components for adding a delay to a signal, such as one or more buffers, one or more inverters, or a combination thereof. The delay element 402 may be implemented as a separate component (as depicted in FIG. 4) or as part of another digital component (e.g., the control logic 404 or the DSP 102). The delay element 402 may receive an input signal (e.g., a digital input signal, such as audio signal 114 or digital signal 118) at an input node (labeled "Din"). The delay element 402 may be configured to delay the input signal to generate a delayed version of the input signal at an output of the delay element. By delaying the input signal, the delay element 402 may provide additional time to allow the control logic 404 to effectively implement the look-ahead feature (i.e., the predictive class-G function) and configure the operating mode of the boost converter 406 based on a point in the input signal before the amplifier 408 amplifies that point in the input signal (or in this case, the delayed version thereof).

The boost converter 406 may be similar to the boost converter 200 of FIGS. 2A and 2B and may have an output coupled to a power supply input of the amplifier 408. The amplifier 408 may have an input coupled to an output of the delay element 402. For certain aspects, the amplifier 408 may be similar to the amplifier 110 in FIG. 1 and may function as (or include) a speaker driver or another type of amplifier. For other aspects, the amplifier 408 may include additional components and implement additional functions, such as digital-to-analog conversion by a DAC (e.g., the DAC 108 of FIG. 1). The amplifier 408 may be configured to amplify the delayed version of the input signal for outputting at an output node (labeled "Vout") of the amplification circuit 400.

The control logic 404 may have a first input coupled to the input node Din and the input of the delay element 402, a second input coupled to the output of the delay element 402, and an output coupled to a control input (labeled "Boost_ref") of the boost converter 406. The control logic 404 may generally include a class-H controller 410, a class-G controller 412, and a multiplexer 414. The class-H controller 410 may have an input coupled to the second input of the control logic 404. The class-G controller 412 may have one input coupled to the first input of the control logic 404 and another input coupled to the second input of the control logic. In certain aspects, the class-H controller 410 may have an 8-bit output (serial or parallel), allowing for 256 different output values to effectively implement continuous tracking, while in other aspects, the class-H controller may have an output with more or less than 8 bits. In certain aspects, the class-G controller may have a 4-bit output (serial or parallel), which allows for 16 different output levels, while in other aspects the class-G controller may have an output with more or less than 4 bits. The multiplexer 414 may have a first set of inputs coupled to one or more outputs of the class-H controller 410, a second set of inputs coupled to one or more outputs of the class-G controller 412, and an output serving as the output of the control logic 404 and coupled to the control input of the boost converter 406. In some aspects, the multiplexer 414 may have one or more control inputs coupled to a set of outputs of the class-G controller 412, as shown in FIG. 4 for control selection between the first and second sets of inputs to the multiplexer.

According to certain aspects, the control logic 404 may be configured to selectively control the boost converter 406 to operate in at least one of a predictive class-G mode or a class-H mode, based on a magnitude of the input signal. In some aspects, the predictive class-G mode may be a multi-level predictive class-G mode (e.g., as in FIG. 3C), whereas in other aspects, the predictive class-G mode may be single level predictive class-G mode (e.g., as in FIG. 3B).

According to certain aspects, the control logic 404 may be configured to control the boost converter 406 to operate in the predictive class-G mode when the magnitude of the input signal is greater than a first threshold (e.g., the class-G thresholds 337 and 367 in FIGS. 3B and 3C or the second threshold 254 in FIG. 2C), such that the amplifier 408 has sufficient headroom to amplify the delayed version of the input signal. According to certain aspects, the control logic 404 may be configured to control the boost converter 406, operating in the predictive class-G mode, to charge an output capacitor (e.g., capacitive element C1 in FIGS. 2A and 2B) of the boost converter 406 to a higher voltage than a peak magnitude of the input signal before a peak magnitude of the delayed version of the input signal is received by the amplifier 408.

In certain aspects, the control logic 404 (or a comparator in the boost converter) may be configured to control the boost converter 406 to operate in a bypass mode when the magnitude of the input signal is lower than a second threshold (e.g., the first threshold 252 in FIG. 2C). In certain aspects, the control logic 404 may be configured to control the boost converter 406 to operate in the class-H mode when the magnitude of the input signal is lower than the first threshold. According to certain aspects, the control logic 404 may be configured to control the boost converter 406 to operate in the class-H mode when the magnitude of the input signal is lower than the first threshold and greater than the second threshold (e.g., between the thresholds 252 and 254 in FIG. 2C).

In certain aspects, the control logic 404 may be configured to change a reference voltage (e.g., Boost_ref) for the boost converter 406, operating in the predictive class-G mode (or in the class-H mode), based on the magnitude of the input signal.

Example Operations for Amplification

Figure 5:
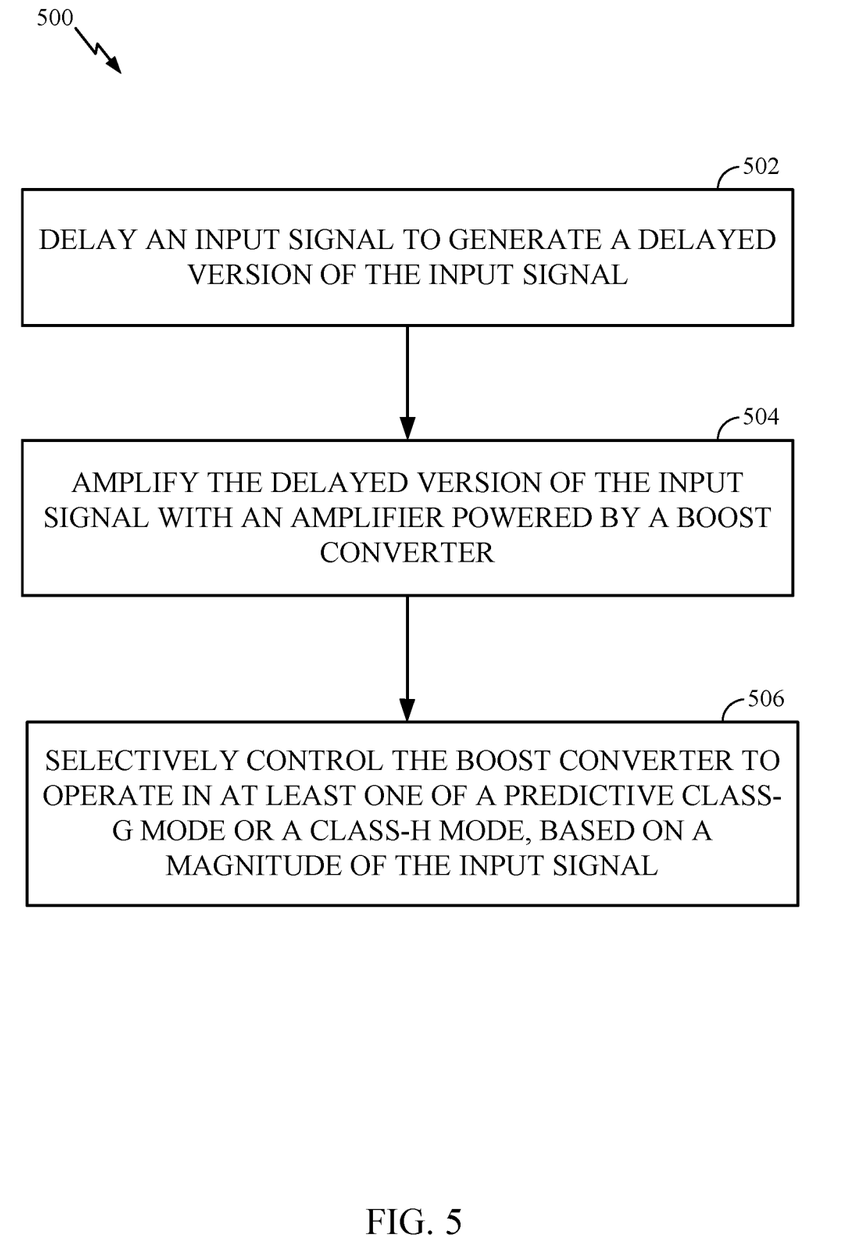
FIG. 5 is a flow diagram of example operations for amplifying an input signal, in accordance with certain aspects of the present disclosure.

FIG. 5 is a flow diagram of example operations 500 for amplifying an input signal, in accordance with certain aspects of the present disclosure. The operations 500 may be performed by an amplification circuit, such as the amplification circuit 400 of FIG. 4.

The operations 500 may begin, at block 502, with the circuit (and more particularly, for example, a delay element, such as the delay element 402) delaying the input signal to generate a delayed version of the input signal. The input signal may be a digital signal, for example. At block 504, the circuit (and more particularly, for example, an amplifier, such as the amplifier 408) may amplify the delayed version of the input signal. The amplifier may be powered by a boost converter (e.g., the boost converter 406). At block 506, the circuit (and more particularly, in some cases, control logic, such as control logic 404) may selectively control the boost converter to operate in at least one of a predictive class-G mode or a class-H mode, based on a magnitude of the input signal. For certain aspects, the circuit may selectively control the boost converter to operate in at least one of a predictive class-G mode, a class-H mode, or a bypass mode, based on a magnitude of the input signal.

According to certain aspects, selectively controlling the boost converter at block 506 may involve controlling the boost converter to operate in the predictive class-G mode when the magnitude of the input signal is greater than a first threshold (e.g., a class-G threshold, such as the class-G threshold 337 or 367), such that the amplifier has sufficient headroom to amplify the delayed version of the input signal. In this case, controlling the boost converter to operate in the predictive class-G mode may include charging an output capacitor (e.g., capacitor C1) of the boost converter to a higher voltage than a peak magnitude of the input signal before a peak magnitude of the delayed version of the input signal is received by the amplifier. In some cases, controlling the boost converter to operate in the predictive class-G mode may include changing a reference voltage (Boost_ref) for the boost converter based on the magnitude of the input signal. For certain aspects, selectively controlling the boost converter at block 506 further involves controlling the boost converter to operate in the class-H mode when the magnitude of the input signal is lower than the first threshold and greater than a second threshold (e.g., a class-H threshold, such as the battery voltage Vbat). Furthermore, selectively controlling the boost converter at block 506 may further include controlling the boost converter to operate in a bypass mode when the magnitude of the input signal is lower than the second threshold. For other aspects, selectively controlling the boost converter at block 506 involves controlling the boost converter to operate in the class-H mode when the magnitude of the input signal is lower than the first threshold.

According to certain aspects, the predictive class-G mode is a multi-level predictive class-G mode (e.g., with multiple class-G thresholds, such as the class-G thresholds 367).

Example Aspects

In addition to the various aspects described above, specific combinations of aspects are within the scope of the disclosure, some of which are detailed below:

Aspect 1: A method of amplification, comprising: delaying an input signal to generate a delayed version of the input signal; amplifying the delayed version of the input signal with an amplifier powered by a boost converter; and selectively controlling the boost converter to operate in at least one of a predictive class-G mode or a class-H mode, based on a magnitude of the input signal.

Aspect 2: The method of Aspect 1, wherein the selectively controlling comprises controlling the boost converter to operate in the predictive class-G mode when the magnitude of the input signal is greater than a first threshold, such that the amplifier has sufficient headroom to amplify the delayed version of the input signal.

Aspect 3: The method of Aspect 1 or 2, wherein controlling the boost converter to operate in the predictive class-G mode comprises charging an output capacitor of the boost converter to a higher voltage than a peak magnitude of the input signal before a peak magnitude of the delayed version of the input signal is received by the amplifier.

Aspect 4: The method of any of the preceding Aspects, wherein the selectively controlling further comprises controlling the boost converter to operate in the class-H mode when the magnitude of the input signal is lower than the first threshold and greater than a second threshold.

Aspect 5: The method of Aspect 4, wherein the selectively controlling further comprises controlling the boost converter to operate in a bypass mode when the magnitude of the input signal is lower than the second threshold.

Aspect 6: The method of Aspect 2 or 3, wherein the selectively controlling further comprises controlling the boost converter to operate in the class-H mode when the magnitude of the input signal is lower than the first threshold.

Aspect 7: The method of any of the preceding Aspects, wherein controlling the boost converter to operate in the predictive class-G mode comprises changing a reference voltage for the boost converter based on the magnitude of the input signal.

Aspect 8: The method of any of the preceding Aspects, wherein the predictive class-G mode comprises a multi-level predictive class-G mode.

Aspect 9: An amplification circuit comprising: a delay element; an amplifier having an input coupled to an output of the delay element; a boost converter having an output coupled to a power supply input of the amplifier; and control logic having a first input coupled to an input of the delay element, having a second input coupled to the output of the delay element, and having an output coupled to a control input of the boost converter, wherein the control logic is configured to selectively control the boost converter to operate in at least one of a predictive class-G mode or a class-H mode, based on a magnitude of an input signal.

Aspect 10: The amplification circuit of Aspect 9, wherein: the delay element is configured to delay the input signal to generate a delayed version of the input signal; the amplifier is configured to amplify the delayed version of the input signal; and the control logic is configured to control the boost converter to operate in the predictive class-G mode when the magnitude of the input signal is greater than a first threshold, such that the amplifier has sufficient headroom to amplify the delayed version of the input signal.

Aspect 11: The amplification circuit of Aspect 9 or 10, wherein the control logic is configured to control the boost converter, operating in the predictive class-G mode, to charge an output capacitor of the boost converter to a higher voltage than a peak magnitude of the input signal before a peak magnitude of the delayed version of the input signal is received by the amplifier.

Aspect 12: The amplification circuit of any of Aspects 9-11, wherein the control logic is configured to control the boost converter to operate in the class-H mode when the magnitude of the input signal is lower than the first threshold and greater than a second threshold.

Aspect 13: The amplification circuit of Aspect 12, wherein the control logic is configured to control the boost converter to operate in a bypass mode when the magnitude of the input signal is lower than the second threshold.

Aspect 14: The amplification circuit of Aspect 10 or 11, wherein the control logic is configured to control the boost converter to operate in the class-H mode when the magnitude of the input signal is lower than the first threshold.

Aspect 15: The amplification circuit of any of Aspects 9-14, wherein the control logic is configured to change a reference voltage for the boost converter, operating in the predictive class-G mode, based on the magnitude of the input signal.

Aspect 16: The amplification circuit of any of Aspects 9-15, wherein the control logic comprises: a class-H controller having an input coupled to the second input of the control logic; a class-G controller having an input coupled to the first input of the control logic; and a multiplexer having a first set of inputs coupled to one or more outputs of the class-H controller, having a second set of inputs coupled to one or more outputs of the class-G controller, and having an output coupled to the control input of the boost converter.

Aspect 17: The amplification circuit of Aspect 16, wherein the multiplexer has one or more control inputs coupled to a set of outputs of the class-G controller.

Aspect 18: The amplification circuit of any of Aspects 9-17, wherein the predictive class-G mode comprises a multi-level predictive class-G mode.

Aspect 19: The amplification circuit of any of Aspects 9-18, wherein the amplifier comprises a speaker driver.

Aspect 20: An apparatus for amplification, comprising: means for delaying an input signal to generate a delayed version of the input signal; means for amplifying the delayed version of the input signal; means for regulating power to the amplifier; and means for selectively controlling the means for regulating power to operate in at least one of a predictive class-G mode or a class-H mode, based on a magnitude of the input signal.

Additional Considerations

Certain aspects of the present disclosure provide a hybrid class-H/predictive class-G amplifier architecture. The hybrid amplifier architecture works by charging up the boost converter output capacitor to a higher voltage (class-G, which still follows the speaker signal, but with look-ahead capabilities) before the signal peak occurs. When the signal peak occurs, though the battery current is limited, the speaker signal should still be clean because the boost capacitor will be able to provide the rest of the charge. Although the boost output may droop, the amplified signal should still be clean as long as the droop is not large enough to eat into the speaker driver's headroom margin. In this manner, the hybrid class-H/predictive class-G amplifier architecture is able to deliver much higher power for mid-to-high frequencies, even with limited battery current. Furthermore, efficiency for low power is not compromised.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for delaying may include a delay element, such as the delay element 402 as illustrated in FIG. 4. Means for amplifying may include an amplifier, such as the amplifier 110 shown in FIG. 1 or the amplifier 408 depicted in FIG. 4. Means for regulating power may include a voltage regulator, such as the boost converter 200 shown in FIG. 2 or the boost converter 406 portrayed in FIG. 4. Means for selectively controlling may include control logic, such as the control logic 404 depicted in FIG. 4.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A method of amplification, comprising:
   delaying an input signal to generate a delayed version of the input signal;
   amplifying the delayed version of the input signal with an amplifier powered by a boost converter; and
   selectively controlling, via control logic, the boost converter to operate in at least one of a predictive class-G mode or a class-H mode, based on a magnitude of the input signal, wherein the boost converter is selectively controlled via the control logic further based on the delayed version of the input signal.

2. The method of claim 1, wherein the selectively controlling comprises controlling the boost converter to operate in the predictive class-G mode when the magnitude of the input signal is greater than a first threshold, such that the amplifier has sufficient headroom to amplify the delayed version of the input signal.

3. The method of claim 2, wherein controlling the boost converter to operate in the predictive class-G mode comprises charging an output capacitor of the boost converter to a higher voltage than a peak magnitude of the input signal before a peak magnitude of the delayed version of the input signal is received by the amplifier.

4. The method of claim 2, wherein the selectively controlling further comprises controlling the boost converter to operate in the class-H mode when the magnitude of the input signal is lower than the first threshold and greater than a second threshold.

5. The method of claim 4, wherein the selectively controlling further comprises controlling the boost converter to operate in a bypass mode when the magnitude of the input signal is lower than the second threshold.

6. The method of claim 2, wherein the selectively controlling further comprises controlling the boost converter to operate in the class-H mode when the magnitude of the input signal is lower than the first threshold.

7. The method of claim 2, wherein controlling the boost converter to operate in the predictive class-G mode comprises changing a reference voltage for the boost converter based on the magnitude of the input signal.

8. The method of claim 1, wherein the predictive class-G mode comprises a multi-level predictive class-G mode.

9. An amplification circuit comprising:
   a delay element;
   an amplifier having an input coupled to an output of the delay element;
   a boost converter having an output coupled to a power supply input of the amplifier; and
   control logic having a first input coupled to an input of the delay element, having a second input coupled to the output of the delay element, and having an output coupled to a control input of the boost converter, wherein the control logic is configured to selectively control the boost converter to operate in at least one of a predictive class-G mode or a class-H mode, based on a magnitude of an input signal.

10. The amplification circuit of claim 9, wherein:
    the delay element is configured to delay the input signal to generate a delayed version of the input signal;
    the amplifier is configured to amplify the delayed version of the input signal; and
    the control logic is configured to control the boost converter to operate in the predictive class-G mode when the magnitude of the input signal is greater than a first threshold, such that the amplifier has sufficient headroom to amplify the delayed version of the input signal.

11. The amplification circuit of claim 10, wherein the control logic is configured to control the boost converter, operating in the predictive class-G mode, to charge an output capacitor of the boost converter to a higher voltage than a peak magnitude of the input signal before a peak magnitude of the delayed version of the input signal is received by the amplifier.

12. The amplification circuit of claim 10, wherein the control logic is configured to control the boost converter to operate in the class-H mode when the magnitude of the input signal is lower than the first threshold and greater than a second threshold.

13. The amplification circuit of claim 12, wherein the control logic is configured to control the boost converter to operate in a bypass mode when the magnitude of the input signal is lower than the second threshold.

14. The amplification circuit of claim 10, wherein the control logic is configured to control the boost converter to operate in the class-H mode when the magnitude of the input signal is lower than the first threshold.

15. The amplification circuit of claim 10, wherein the control logic is configured to change a reference voltage for the boost converter, operating in the predictive class-G mode, based on the magnitude of the input signal.

16. The amplification circuit of claim 9, wherein the control logic comprises:
a class-H controller having an input coupled to the second input of the control logic;
a class-G controller having an input coupled to the first input of the control logic; and
a multiplexer having a first set of inputs coupled to one or more outputs of the class-H controller, having a second set of inputs coupled to one or more outputs of the class-G controller, and having an output coupled to the control input of the boost converter.

17. The amplification circuit of claim 16, wherein the multiplexer has one or more control inputs coupled to a set of outputs of the class-G controller.

18. The amplification circuit of claim 9, wherein the predictive class-G mode comprises a multi-level predictive class-G mode.

19. The amplification circuit of claim 9, wherein the amplifier comprises a speaker driver.

20. An apparatus for amplification, comprising:
means for delaying an input signal to generate a delayed version of the input signal;
means for amplifying the delayed version of the input signal;
means for regulating power to the amplifier; and
means for selectively controlling the means for regulating power to operate in at least one of a predictive class-G mode or a class-H mode, based on a magnitude of the input signal, wherein the means for selectively controlling is configured to selectively control the means for regulating power further based on the delayed version of the input signal.

* * * * *